US011960045B2

(12) United States Patent
Shahraeeni

(10) Patent No.: US 11,960,045 B2
(45) Date of Patent: Apr. 16, 2024

(54) METHOD OF CHARACTERISING A SUBSURFACE REGION USING MULTIPLE POINT STATISTICS

(71) Applicant: TOTAL SE, Courbevoie (FR)

(72) Inventor: Mohammad Shahraeeni, Aberdeen (GB)

(73) Assignee: TOTAL SE, Courbevoie (FR)

( * ) Notice: Subject to any disclaimer, the term of this patent is extended or adjusted under 35 U.S.C. 154(b) by 671 days.

(21) Appl. No.: 16/314,057

(22) PCT Filed: Jul. 7, 2016

(86) PCT No.: PCT/GB2016/052049
§ 371 (c)(1),
(2) Date: Dec. 28, 2018

(87) PCT Pub. No.: WO2018/007775
PCT Pub. Date: Jan. 11, 2018

(65) Prior Publication Data
US 2019/0243024 A1 Aug. 8, 2019

(51) Int. Cl.
*G01V 20/00* (2024.01)
*G01V 1/28* (2006.01)
*G06F 30/20* (2020.01)

(52) U.S. Cl.
CPC ............... *G01V 20/00* (2024.01); *G01V 1/28* (2013.01); *G06F 30/20* (2020.01)

(58) Field of Classification Search
CPC ......... G01V 99/005; G01V 1/28; G06F 30/20
See application file for complete search history.

(56) References Cited

U.S. PATENT DOCUMENTS 7,516,055 B2 4/2009 Strebelle
2006/0041410 A1* 2/2006 Strebelle .................. G01V 1/30
703/10

(Continued)

FOREIGN PATENT DOCUMENTS

WO WO-2009138290 A2 * 11/2009 ............. G01V 11/00

OTHER PUBLICATIONS

Wu, Jianbing, Tuanfeng Zhang, and Alexandre Boucher. "Non-stationary multiple-point geostatistical simulations with region concept." Proceedings of the 20th SCRF meeting, Stanford, CA, USA. 2007. (Year: 2007).*

(Continued)

*Primary Examiner* — Boris Gorney
*Assistant Examiner* — David A Hopkins
(74) *Attorney, Agent, or Firm* — Lando & Anastasi, LLP

(57) ABSTRACT

Disclosed are methods of modelling a subsurface region. One method comprises defining a plurality of variables for describing said subsurface region, each variable having a corresponding, domain set neighbourhood set, and conflict set. The conflict set comprises conflict variables, which are previously assigned variable which reduces the domain set of its corresponding variable. The method comprises further sequentially performing for each variable: a) selecting an unassigned variable; b) assigning a value to the selected variable from its domain set; c) assessing whether a constraint is satisfied. The selected variable's corresponding conflict set is updated to include any previously assigned variables comprised within the selected variable's corresponding neighbourhood set when said constraint is assessed not to be satisfied at step c). Another method comprises foreseeing dead end variables before they are simulated.

13 Claims, 5 Drawing Sheets

(56) References Cited

U.S. PATENT DOCUMENTS

| | | | |
|---|---|---|---|
| 2009/0164182 A1* | 6/2009 | Pedersen | G01V 11/00 |
| | | | 703/2 |
| 2012/0179436 A1 | 7/2012 | Fung | |
| 2013/0262053 A1* | 10/2013 | Plost | G01V 99/005 |
| | | | 703/2 |
| 2014/0037197 A1* | 2/2014 | Thorne | G06K 9/6255 |
| | | | 382/159 |
| 2015/0131866 A1 | 5/2015 | Le Ravalec | |
| 2015/0142407 A1* | 5/2015 | Wakefield | E02D 1/027 |
| | | | 703/10 |
| 2015/0317419 A1* | 11/2015 | Jeong | G06F 17/18 |
| | | | 703/2 |
| 2016/0041279 A1* | 2/2016 | Casey | G06T 17/05 |
| | | | 703/2 |

OTHER PUBLICATIONS

Dechter, Rina, and Daniel Frost. "Backjump-based backtracking for constraint satisfaction problems." Artificial Intelligence 136.2 (2002): 147-188. (Year: 2002).*

Frost, Daniel, and Rina Dechter. "Look-ahead value ordering for constraint satisfaction problems." IJCAI (1). 1995. (Year: 1995).*

Carrillat, Alexis, Sachin Kumar Sharma, and Tino Grossmann. "Geomodeling of giant carbonate oilfields with a new multipoint statistics workflow." Abu dhabi international petroleum exhibition and conference. OnePetro, 2010. (Year: 2010).*

Chugunova, Tatiana L., and Lin Y. Hu. "Multiple-point simulations constrained by continuous auxiliary data." Mathematical geosciences 40.2 (2008): 133-146. (Year: 2008).*

Hu, L. Y., and T. Chugunova. "Multiple-point geostatistics for modeling subsurface heterogeneity: A comprehensive review." Water Resources Research 44.11 (2008). (Year: 2008).*

Hu, L. Y., et al. "Multiple-point simulation with an existing reservoir model as training image." Mathematical Geosciences 46.2 (2014): 227-240. (Year: 2014).*

Liu, Yuhong, et al. "Multiple-point simulation integrating wells, three-dimensional seismic data, and geology." AAPG bulletin 88.7 (2004): 905-921. (Year: 2004).*

Mohamed, Azlinah, et al. "Constraint satisfaction problem using modified branch and bound algorithm." WSEAS Transactions on Computers 7.1 (2008): 1-7. (Year: 2008).*

Shahraeeni, M. S. "Multiple-Point Statistics Simulation as a Constraint Satisfaction Problem." 80th EAGE Conference and Exhibition 2018. vol. 2018. No. 1. European Association of Geoscientists & Engineers, 2018. (Year: 2018).*

Strebelle, Sebastien. "Conditional simulation of complex geological structures using multiple-point statistics." Mathematical geology 34.1 (2002): 1-21. (Year: 2002).*

Strebelle, S., and S. Suzuki. "Real-time post-processing method to enhance multiple-point statistics simulation." EAGE Conference on Petroleum Geostatistics. European Association of Geoscientists & Engineers, 2007. (Year: 2007).*

Zhang, Tuanfeng, et al. "Memory-efficient categorical multi-point statistics algorithms based on compact search trees." Mathematical geosciences 44.7 (2012): 863-879. (Year: 2012).*

Abdollahifard, Mohammad J., and Karim Faez. "Fast direct sampling for multiple-point stochastic simulation." Arabian Journal of Geosciences 7 (2014): 1927-1939 (Year: 2014).*

Abdollahifard, Mohammad J. "Fast multiple-point simulation using a data-driven path and an efficient gradient-based search." Computers & geosciences 86 (2016): 64-74 (Year: 2016).*

Abdollahifard, Mohammad J., and Sadegh Ahmadi. "Reconstruction of binary geological images using analytical edge and object models." Computers & Geosciences 89 (2016): 239-251 (Year: 2016).*

Huang, Tao, et al. "GPU-based SNESIM implementation for multiple-point statistical simulation." Computers & geosciences 54 (2013): 75-87. (Year: 2013).*

Mariethoz, Gregoire, Philippe Renard, and Julien Straubhaar. "The direct sampling method to perform multiple-point geostatistical simulations." Water Resources Research 46.11 (2010). (Year: 2010).*

Mariethoz, Gregoire, and Philippe Renard. "Reconstruction of incomplete data sets or images using direct sampling." Mathematical Geosciences 42 (2010): 245-268 (Year: 2010).*

Mariethoz, Grégoire. "A general parallelization strategy for random path based geostatistical simulation methods." Computers & Geosciences 36.7 (2010): 953-958 (Year: 2010).*

Soltan Mohammadi, Hesam, Mohammad Javad Abdollahifard, and Faramarz Doulati Ardejani. "CHDS: conflict handling in direct sampling for stochastic simulation of spatial variables." Stochastic Environmental Research and Risk Assessment 34 (2020): 825-847 (Year: 2020).*

Remy et al., "Applied Geostatistics with SGeMS a User's Guide", Textbook, 2009, Cambridge University Press, ISBN 978-0-521-51414-9 (Year: 2009).*

Strebelle, Sebastien, and Nicolas Remy. "Post-processing of multiple-point geostatistical models to improve reproduction of training patterns." Geostatistics banff 2004 (2005): 979-988 (Year: 2005).*

Strebelle, S., "Conditional Simulation of Complex Geological Structures Using Multiple-Point Statistics," Mathematical Geology, vol. 34, No. 1, Jan. 2002, p. 1-21.

Mariethoz, G., et al., "The Direct Sampling method to perform multiple point geostatistical simulations," Water Resources Research, vol. 46, 2010, p. 1-14.

Naujoks, Marco, "International Search Report," prepared for PCT/GB2016/052049, as dated May 24, 2017, six pages.

Suzuki, Satomi, et al., "Real-Time Post-Processing Method to Enhance Multiple-Point Statistics Stimulation," URL:https://pangae.stanford.edu/departments/ere/dropbox/scrf/documents/reports/20/SCRF2007_Report20/SCRF2007_suzuki_strebelle.pdf, Sep. 10, 2007, 13 pages.

* cited by examiner

METHOD OF CHARACTERISING A SUBSURFACE REGION USING MULTIPLE POINT STATISTICS

The present disclosure relates to methods of characterising a subsurface region, and in particular to generating geological models using multiple point statistics.

The typical process to establish oil and gas production forecasts includes the construction of 3D subsurface models and flow simulation using such models as an input.

Subsurface models may comprise, for example, reservoir flow, basin, and geo-mechanical models. These comprise gridded 3D representations of the subsurface used as inputs to a simulator allowing the prediction of a range of physical properties as a function of controlled or un-controlled boundary conditions:

Reservoir flow models aim to predict fluid flow properties, primarily multi-phase rates (and composition), pressure and temperature, under oil and gas field or aquifer development scenarios.

Basin models aim to predict over time the types of hydrocarbon being generated out of kerogen, and the location of hydrocarbon trapping at geological timescales.

Geo-mechanical models aim to predict stress and stress related phenomenon such as heave/subsidence or failure in natural conditions or under oil and gas or aquifer development conditions.

One form of generating geological simulations comprises the use of multi-point statistics (MPS), which may improve quality and efficiency when compared to traditional geostatistical techniques. Geostatistical simulation using such MPS techniques relies on extracting multiple points statistics from training information, such as a training image. A training image is a conceptual geological model which imposes certain constraints on the simulation. The training information is used to integrate geological information into reservoir models. An issue with such MPS techniques is the occurrence of dead-end pixels (also referred to as dead-end variables). These are pixels for which, when simulated, no value can be found which satisfies the criteria defined by the training information. This is usually as a result of values previously assigned to other pixels within the vicinity of the dead-end pixel. A limited predefined number of previously simulated pixels in the neighbourhood of each pixel are used typically for conditioning a pixel during simulation. Should the values assigned to these previously simulated pixels mean that there is no value assignable to the pixel being simulated which satisfies the criteria defined by the training information, then the pixel is a dead-end pixel. Various techniques have been proposed for dealing with the issue of dead-end pixels.

It would be desirable to provide an improved method of addressing the issue of dead-end pixels in geological simulations using multi-point statistics techniques.

SUMMARY OF INVENTION

In a first aspect of the invention there is provided a method of characterising a subsurface region comprising:

defining a plurality of variables for describing said subsurface region, each variable having corresponding thereto:
a domain set, said domain set comprising zero or more possible values assignable to its corresponding variable, a neighbourhood set, each neighbourhood set comprising a subset of said plurality of variables which neighbour its corresponding variable, and a conflict set comprising zero or more conflict variables, each conflict variable comprising a previously assigned variable which reduces the domain set of its corresponding variable;

sequentially performing the following steps a) to c) for each variable of said plurality of variables:

a) selecting an unassigned variable from said plurality of variables;

b) assigning a value to the selected variable from the selected variable's corresponding domain set, provided it is not empty; and c) assessing whether a constraint is satisfied with the selected variable assigned the assigned value;

said method further comprising: updating the selected variable's corresponding conflict set to include any conflict variables; said conflict variables being any previously assigned variables comprised within the selected variable's corresponding neighbourhood set when said constraint is assessed not to be satisfied at step c).

A subsurface region may comprise a subsurface area or subsurface volume, which may be represented by a set of cells referred to as pixels or variables hereafter. Note that the definition of pixel or variable encompasses those of 2D models or 3D models (when they may also be referred to as voxels).

In a second aspect of the invention there is provided a method of characterising a subsurface region comprising:

defining a plurality of variables for describing said subsurface region, each variable having:

a corresponding domain set, said domain set comprising zero or more possible values assignable to its corresponding variable, a corresponding template set, each template set comprising a subset of said plurality of variables having a positional relationship with its corresponding variable determined by a predefined template;

said method further comprising:

a) selecting an unassigned variable from said plurality of variables;

b) assigning a value to the selected variable from the selected variable's corresponding domain set, provided it is not empty;

c) for each template variable, wherein a template variable comprises an unassigned variable within the selected variable's template set:

assessing whether a constraint is satisfied with the selected variable assigned the assigned value at step b) and said template variable assigned, sequentially, each value in its corresponding domain set;

d) where for at least one of said template variables, said constraint is not satisfied for any value in the domain set corresponding to that template variable, determining that template variable to be a foreseen dead-end variable Other aspects of the invention comprise a computer program comprising computer readable instructions which, when run on suitable computer apparatus, cause the computer apparatus to perform the method of the first aspect; and an apparatus specifically adapted to carry out all the steps of any of the method of the first aspect.

Other non-essential features of the invention are as claimed in the appended dependent claims.

BRIEF DESCRIPTION OF THE DRAWINGS

Embodiments of the invention will now be described, by way of example only, by reference to the accompanying drawings, in which.

DETAILED DESCRIPTION OF THE EMBODIMENTS

Figure 1:
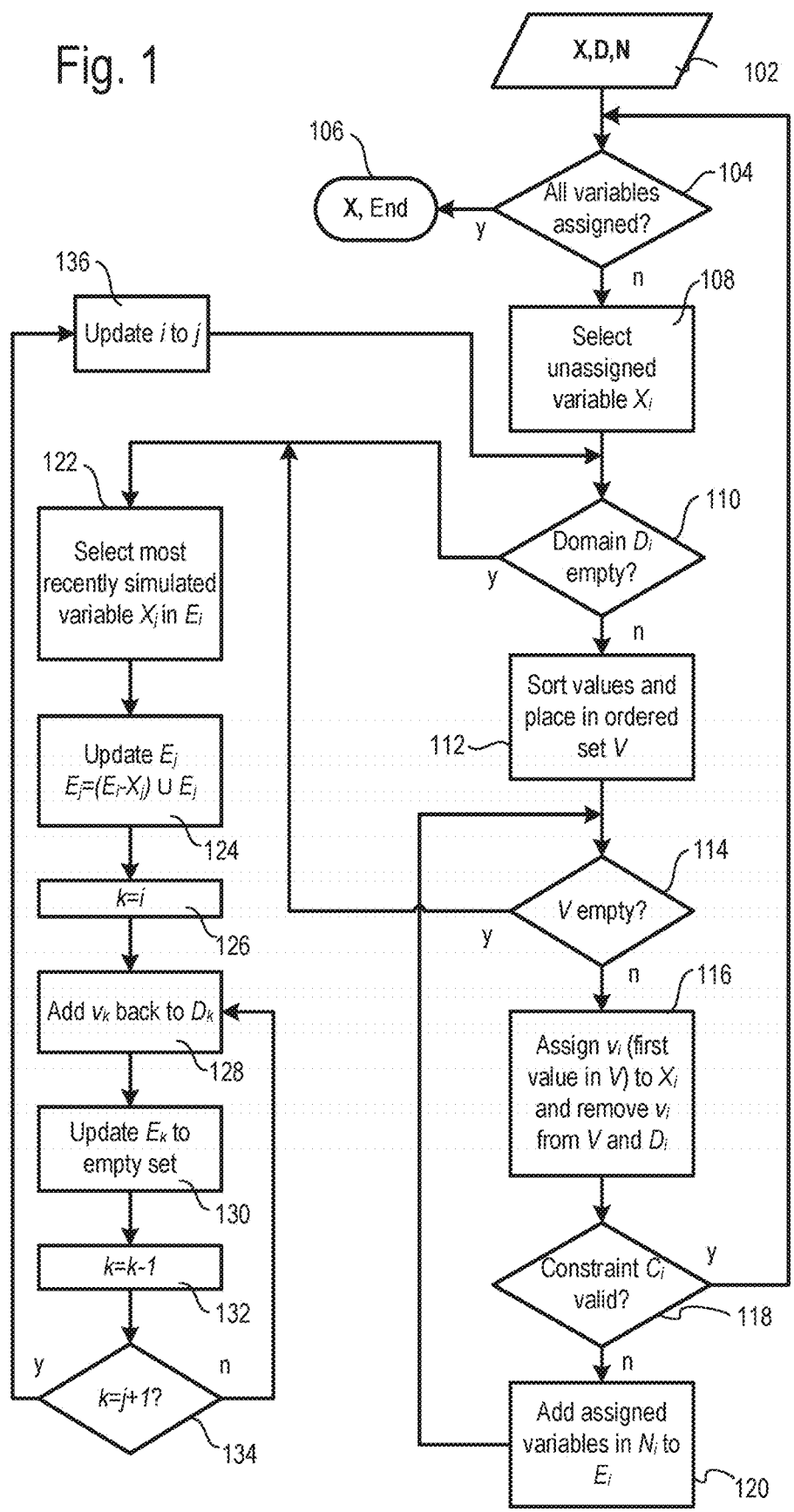
FIG. 1 comprises a flowchart illustrating a method of conflict directed back-jumping according to an embodiment of the invention, usable as part of a modelling method using multi-point statistics.

The problem of generating geological models using multiple point statistics (MPS), which is referred to as MPS simulation, has been studied for almost 15 years. MPS simulation concerns pixel-based models, which represent the interior of the earth as a set of pixels (or variables) each of which represents properties of the earth in its vicinity. The objective of MPS simulation is to generate several realizations of models of some geological properties with spatial properties, i.e. patterns, similar to some given training information (e.g., a training image). Current MPS simulation methods are sequential, in which a simulated value at each pixel in a simulation grid is extracted from the training image given the values of previously simulated pixels at different locations or in other words conditioned to previously simulated pixels. In order to make MPS simulation computationally tractable, a limited predefined number of previously simulated pixels in the neighbourhood of each pixel are used for conditioning. Different MPS methods differ from each other in their definition of the neighbourhood.

Proper simulation of each pixel, in the course of MPS sequential simulation, requires availability—within an acceptable mismatch threshold—of the neighbourhood of that pixel in the training information. For example, where the MPS simulation is a single normal equation simulation (SNESIM) method, such that the neighbourhood of a pixel is defined as those pixels within a template shape around the pixel, the training image may be decomposed into a library of such templates. When a value is assigned to a selected pixel, a check is made to determine whether the training image (i.e., the template library) comprises any matching templates having the selected pixel's assigned value and neighbourhood. If one or more matches are available (within the mismatch threshold), the availability condition is satisfied. If the availability condition is not satisfied for a pixel, the pixel is then referred to as a dead-end pixel, the sequential simulation is unable to generate a proper value and will stop. Hence, resuming the simulation at a dead-end pixel requires a method to change the value of the simulated property at neighbourhood pixels such that the availability condition is satisfied. Current methods to solve the problem of dead-end pixels fall into three categories:

1. Ignoring Previously Simulated Pixels in the Neighbourhood (Strebelle, 2002)

In this method, a simulated pixel from the neighbourhood of the dead-end pixel is dropped and the availability condition is checked for this new reduced neighbourhood; the dropping process continues until the availability condition is satisfied. This method is able to resolve any dead-end pixel; however, due to the fact that some of the previously simulated pixels are ignored, the MPS properties of the training information are not preserved in the simulated image. Consequences of this are explained later, in the text accompanying FIG. 5.

2. Real Time Post Processing (Suzuki and Strebelle, 2007)

In this method, sequential simulation is performed on a predefined raster path. When a dead-end pixel is encountered, the previous pixel is revisited and all possible values for the combination of that pixel and the dead-end pixel are generated. If the availability condition is satisfied for any of these combinations, the combination is accepted as the simulation value for these two pixels and simulation continues. Otherwise, the pixel before the previous pixel is revisited and the above procedure is repeated for all possible values of the combination of these three pixels. The procedure of revisiting the previously simulated pixels repeats until the availability condition is satisfied. The application of this method shows that, in some cases, the MPS properties of the training information are not preserved in the simulated image. Another limitation of this method is the use of a predefined raster path as the simulation path.

3. Syn-Processing (Mariethoz, et al., 2010)

In this method, a simulated pixel in the neighbourhood of the dead-end pixel is selected randomly and its value is simulated again. If the availability condition for the dead-end pixel is satisfied due to the new simulated value, simulation continues. Otherwise, the above procedure is repeated for a randomly selected simulated pixel in the neighbourhood of the previously selected pixel. The random selection of a simulated pixel continues until the availability condition is satisfied. The main limitation of this method is that it does not necessarily result in satisfaction of the availability condition at the dead-end pixel.

This new technique for MPS simulation provides a solution to the problem of dead-end pixels which is fundamentally different in construction to methods described above. In the previous cases, due to the presence of dead-end pixels and lack of a correct method to resolve them, the MPS properties of the simulated image are not always similar to that of training information. In this new approach, the MPS simulation is represented as a combinatorial optimization problem, the objective of which is to prevent any dead-end pixel whilst retaining the MPS properties of the training information. The resulting combinatorial optimization problem always has a solution that can be computed. As such, this is the first correct solution for the dead-end pixel problem. Because of this, the method is able to complete a partial realization with MPS properties similar to a given training information. The method is also able to generate realizations conditioned to a secondary variable with a different resolution.

The pixels of the simulation grid in the MPS simulation are a set of unknown variables $X=\{X_1, X_2, \ldots, X_n\}$. The index j of each variable $X_j$ denotes the order in which it is simulated (that is, has a value from its domain set assigned thereto). Each of these variables has a domain set of possible values $D=\{D_1, D_2, \ldots, D_n\}$. The domain set D may either be discrete, such as labels for facies, or piecewise continuous such as a porosity range of each facies. For each variable $X_i$, a neighbourhood set $N_i$ of variables is defined; different options for neighbourhood set definition are introduced subsequently. The objective of optimization is to sequentially assign a value from the domain set $D_i$ to the variable $X_i$ such that the constraint "$C_i$: Availability condition for neighbourhood set $N_i$" is satisfied; different options for the availability condition definition are also introduced subsequently.

Should none of the values within domain set $D_i$ satisfy the constraint, then variable $X_i$ is a dead-end variable (or dead-end pixel). When such a dead-end variable is encountered, a backtracking method may be employed. The backtracking method may comprise going back to the variable $X_{i-1}$ which was simulated (i.e., assigned a value from its domain set) immediately before simulation of the dead-end variable, and re-simulating this variable with a different value from the domain set $D_{i-1}$. It may be that this solves the issue and variable $X_i$ is no longer a dead-end. However, this may not necessarily be the case, and it may be that the variable $X_{i-1}$ may have to be re-simulated again with a yet different value from the domain set $D_{i-1}$, if one is available. If there are no more untried values in the domain set $D_{i-1}$, then the next previously simulated variable $X_{i-2}$ will require re-simulation. Again, it is possible that none of the values in domain set $D_{i-2}$ resolves the dead-end at variable $X_i$, in which case the next previously simulated variable $X_{i-3}$ is re-simulated, and so on. Ultimately, the cause of a particular variable being a dead-end may be the value attributed to a variable simulated many simulation steps prior, and therefore with many other intervening variables having been simulated. It may also be that one of more of the intervening pixels have other values in their domain set which satisfy the constraint, but still result in variable $X_i$ being a dead end. If, so, all of these permutations will also be systematically simulated, before the cause of the dead-end is re-simulated. As there is no way of knowing in advance which of the previously simulated variables is the cause (or is more likely to be the cause) of the dead-end at a particular pixel, the backtracking method must methodically consecutively re-simulate each preceding variable. Consequently, a potentially huge number of permutations of values for the intervening variables may need to be simulated, until the dead-end is resolved. Such an approach is hugely inefficient and computationally expensive, hence the alternative approaches to the dead-end pixel issue which have been proposed and summarised above.

Conflict Directed Back-Jumping

To address this issue, a conflict set $E_i$ associated with each variable $X_i$ may be defined. This is a set of previously assigned variables which reduce the domain set $D_i$ of variable $X_i$, either directly or indirectly (i.e., previously assigned variables which reduce the domain set of a particular variable). When domain set $D_i$ is empty, variable $X_i$ is a dead-end variable. The conflict set allows the tracking of the process of the changing of this domain set, and therefore enables identification of the variable responsible for the dead-end without needing to re-simulate all intervening variables.

FIG. 1 is a flowchart describing an improved backtracking method using a conflict set to monitor domain set changes. At 102, a variable set X, a domain set D and a neighbourhood set N are defined. At step 104 it is determined whether all variables have been assigned; if so, the routine ends 106 with the variable set X returned. If there are still variables to be assigned (as of course there will be on the first iteration) then these variables are assigned sequentially; in step 108 an unassigned variable $X_i$ is selected and values in its domain set $D_i$ (assuming that it is determined not to be empty at step 110) are sorted 112 according to a measure and put in an ordered set V; different options for the sort measure are introduced subsequently. Assuming V is not empty following the determination at step 114, selected variable $X_i$ is assigned with the first value $v_i$ in V and $v_i$ is deleted from the domain set $D_i$ and V (step 116). The constraint $C_i$ is then checked 118; if this constraint $C_i$ is satisfied the routine returns to step 104, and, where there are still variables to be assigned, the next variable is selected for assignment 108 or else the routine ends 106. The order that variables are selected at step 108 may be according to a predetermined order, may be random, or may be according to other criteria. The search path will be predefined if the k-nearest neighbours method is used to define the neighbourhood set (see below in the Example Implementation Details section). The order that variables are selected may also be varied to obtain different realisations.

If the constraint $C_i$ is not satisfied for $v_i$ at step 118, it is recognised that the domain set $D_i$ has changed (value $v_i$ is not valid and is removed from domain set $D_i$ during step 116). Consequently, the assigned variables in the neighbourhood set $N_i$ of variable $X_i$ are added to the conflict set $E_i$ of variable $X_i$ 120. The method returns to step 114 and the procedure is repeated for the next value in V.

If, at step 110, the domain set $D_i$ is empty, or at step 114, ordered set V is empty (e.g., none of the values in domain set $D_i$ satisfies constraint $C_i$) then the variable $X_i$ is a dead-end. In this case, the most recently assigned variable $X_j$ in the conflict set $E_i$ of variable $X_i$ is selected 122. This will be the most recently assigned variable which caused a change in the domain set $D_i$ of variable $X_i$. As such, the algorithm jumps back to the last variable which had an effect on the domain set $D_i$ without backtracking through the intervening variables. The conflict set $E_j$ of variable $X_j$ is updated to also include the conflict set $E_i$ of variable $X_i$ (other than variable $X_j$ itself) 124, i.e.: $(E_i - X_j) \cup E_j$. Then for all the assigned variables between $X_j$ and variable $X_i$ (loop defined by steps 126 to 134), these variables are unassigned. This comprises adding their assigned values back to their domain set 128 and updating their conflict set to empty 130. At step 136, index i is updated to index j. The method then returns to step 110 with variable $X_j$ as the selected variable (as variable $X_i$ in the flowchart) such that the next value in its domain set will be assigned to that variable at step 116 (assuming it is not empty).

This procedure continues until all variables in X are assigned with some values. Several realizations can be generated by changing the order in which different variables are selected and/or by changing the order in which values in V are sorted.

Forward Checking

If the neighbourhood set N is defined as a subset of variables of a template T with a specific shape (e.g., a single normal equation simulation (SNESIM) method is used) then a forward checking procedure can be employed which, after assigning a value to a variable, is able to foresee the occurrence of (neighbouring) dead-end variables.

Due to foreseeing the occurrence of dead-end pixels, the forward checking procedure improves the computation time.

Figure 2:
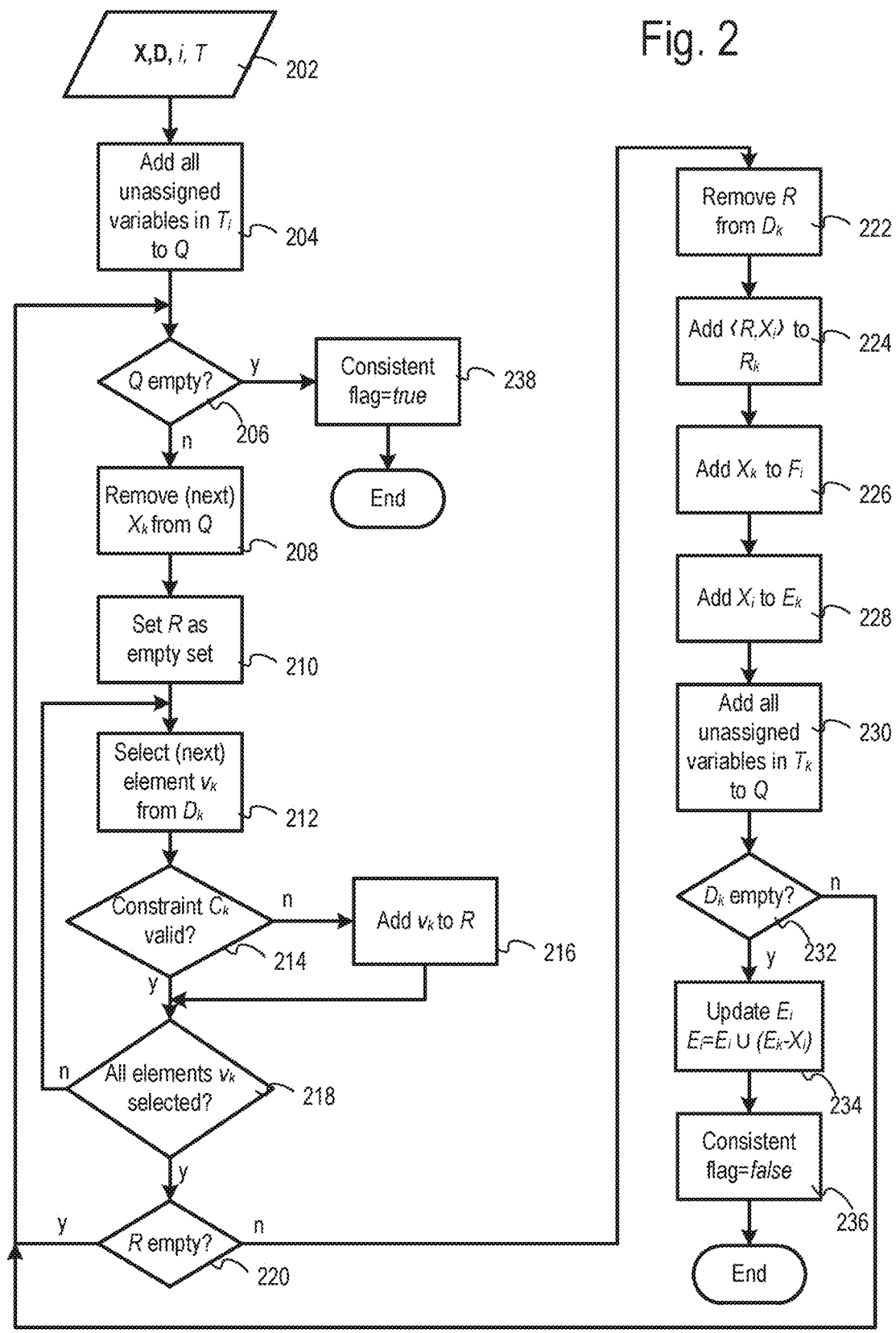
FIG. 2 comprises a flowchart illustrating a method of forward checking for dead-end pixels according to an embodiment of the invention, usable as part of a modelling method using multi-point statistics.

FIG. 2 is a flowchart describing such a forward checking method. A variable set X, a domain set D and a template T are defined. For each variable $X_i$ (e.g., where variable $X_i$ is the selected variable), template set $T_i$ defines all variables around $X_i$ and within template T. For each variable $X_i$, two sets are defined to keep track of changes during the forward checking: 1) a deleted set $R_i$ of 2-tuples $(R, X_j)$; R is the set of values deleted from domain set $D_i$ of variable $X_i$ due to the variable $X_j$, and 2) a forward set $F_i$ that saves the variables $X_k$, within template set $T_i$, that are not assigned before variable $X_i$ and the domain set of which are reduced due to the current value of $X_i$. The forward checking algorithm will return a consistent flag to be either true or false depending on whether a dead-end is foreseen or not.

After assigning a selected variable $X_i$ with a value from its domain set $D_i$ the forward checking is initiated as follows: all unassigned variables within template set $T_i$ corresponding with selected variable $X_i$ are placed in a set Q 204. Then (assuming Q is not empty 206) one variable $X_k$ from set Q is selected and removed 208. At step 210, a set R is initiated as an empty set 210. Then, for all possible values in domain set $D_k$, corresponding to variable $X_k$ (loop 212-218), the constraint $C_k$ is checked 214; if for some values $v_k$ in the domain set $D_k$ this constraint is not satisfied, value $v_k$ is added to set R 216. After all possible values in $D_k$ are checked 218, it is determined whether set R is empty 220. If so, the method returns to step 206, and another variable from set Q (if not empty) is selected and removed and the same procedure repeats for this variable. If set R is not empty at step 220, five actions will be performed:

1) set R is removed from the domain set $D_k$ of variable $X_k$ 222,
2) 2-tuple $(R, X_i)$ is added to deleted set $R_k$ of variable $X_k$ 224,
3) variable $X_k$ is added to the forward set $F_i$ of variable $X_i$ 226,
4) variable $X_i$ is added to conflict set $E_k$ of variable $X_k$ 228, and
5) all unassigned variables in template set $T_k$ are added to set Q 230.

If set R is equal to domain set $D_k$ (i.e., domain set $D_k$ is empty at step 232) then variable $X_k$ is foreseen to be a dead-end variable. In this case the conflict set $E_i$ of variable $X_i$ is updated to include the conflict set $E_k$ of variable $X_k$ (other than variable $X_i$ itself): i.e., $E_i \cup (E_k - X_i)$ 234 and the forward checking returns a false consistent flag 236. If at step 232, it is determined that domain set $D_k$ is not empty the procedure returns to step 206. Where no dead-end variables are foreseen, this procedure continues until set Q becomes empty and forward checking returns a true consistent flag 238.

In this way, by considering the consequences of a change in domain set of neighbouring variables when a particular variable is assigned a particular value, the occurrence that any of these neighbouring variables will become a dead-end variable can be foreseen before that neighbouring variable is simulated.

Conflict Directed Back-Jumping with Forward Checking

Figure 3:
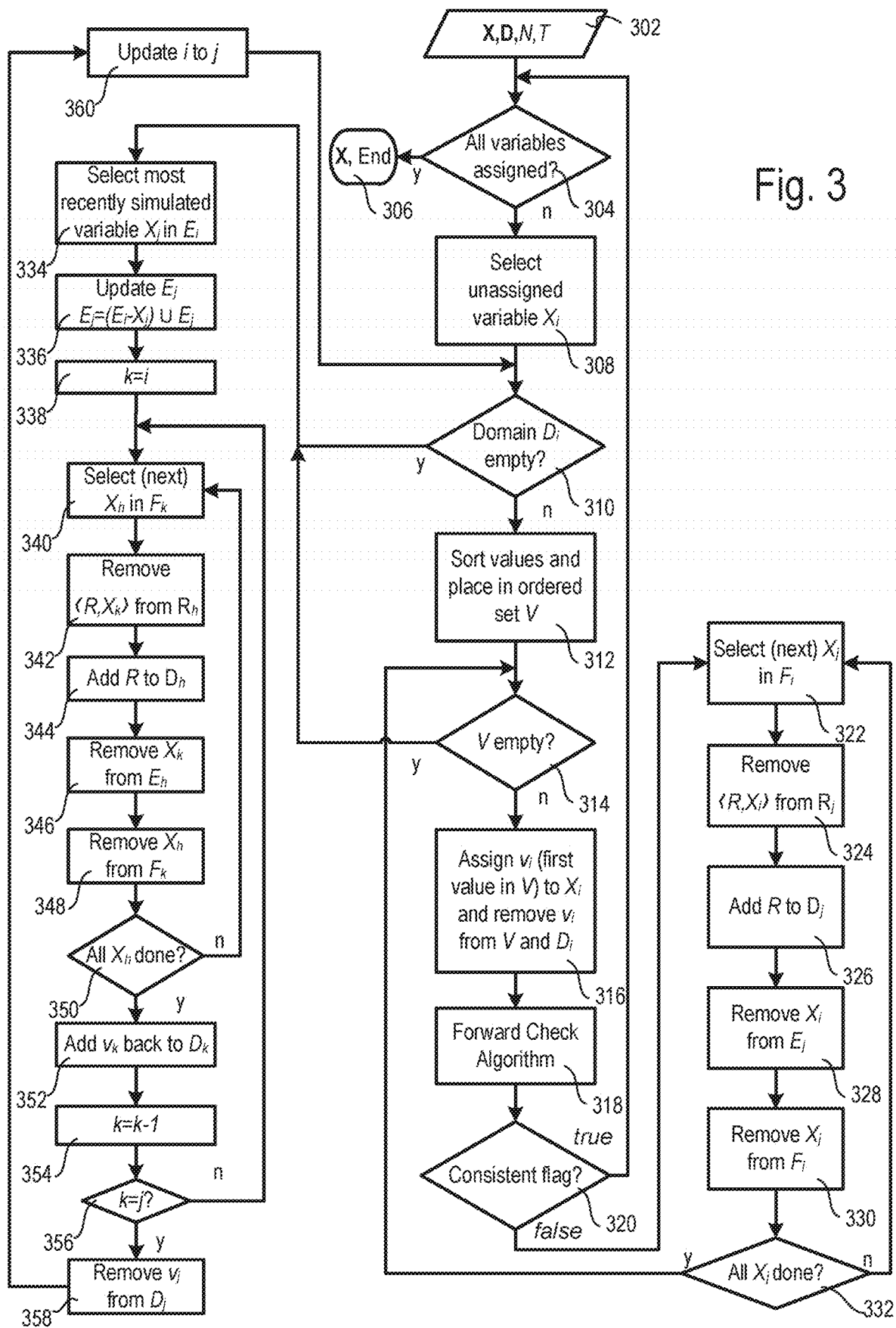
FIG. 3 comprises a flowchart illustrating a method combining the methods shown in FIGS. 1 and 2.

The concepts disclosed above can be combined to provide a method of conflict directed back-jumping with forward checking. As forward checking is employed, the neighbourhood set N is again required to be defined as a subset of variables of a template T with a specific shape (e.g., a SNESIM method is used). FIG. 3 is a flowchart describing such a method.

At step 302, a variable set X, a domain set D, a neighbourhood set N and a template T are defined. After assigning a variable $X_i$ 308, and performing steps 310 to 316 (which mirror steps 110-116 of the conflict directed back-jumping algorithm of FIG. 1) forward checking (e.g., the algorithm described by the flowchart of FIG. 2) is performed 318. The order that variables are selected at step 308 may be according to a predetermined order, may be random, or may be according to other criteria. The order that variables are selected may also be varied to obtain different realisations.

The forward checking algorithm 318 checks whether the availability condition for unassigned variables in template set $T_i$ is satisfied. If so, the consistent flag will be set to true, and following the determination at step 320, the algorithm returns to step 304 to simulate the next variable (if there are any left) or stops, returning the variable set X 306. If forward checking 318 demonstrates that the availability condition for unassigned variables in template set $T_i$ is not satisfied when value $v_i$ is assigned to variable $X_i$, the consistent flag is set to false. When this occurs, the sets $R_j$ 324, $D_j$ 326, $E_j$ 328 and $F_i$ 330 are returned to their original states (that is their states prior to assignment of value $v_i$ to variable $X_i$) for each variable $V_j$ in the forward set $F_i$ of selected variable $X_i$ (loop 322-332). The algorithm then returns to step 314, a new value $v_i'$ (if available) is assigned to selected variable $X_i$ and forward checking 318 is performed again.

If the availability condition for one or more unassigned variables in template set $T_i$ cannot be satisfied for any values $v_i$ in domain set $D_i$, then forward checking 318 foresees a dead-end 310, 314. When this occurs, the most recently assigned variable $X_j$ in conflict set $E_i$ is selected for reassignment 334. Then the conflict set $E_j$ of variable $X_1$ is updated to include the conflict set of selected variable $X_i$ (other than variable $X_i$ itself), i.e.: $E_i \cup (E_k - X_i)$ 336. The domain set, the forward set, the deleted set and the conflict set of variables between $X_i$ and $X_j$ (loop 338-354) are updated as follows to return them to their state before simulation of variable $X_i$. For a variable $X_k$, which is an assigned variable between $X_i$ and $X_j$ (inclusive):

1) For all elements $X_h$ in forward set $F_k$ (loop 340-350):
  a) the element $(R, X_k)$ in deleted set $R_h$ is removed 342 and R is added to domain set $D_h$ 344,
  b) variable $X_k$ is removed from conflict set $E_h$ 346, and
  c) variable $X_h$ is removed from forward set $F_k$ 348;
2) Value $v_k$ is added back to domain set $D_k$ 352.

At step 358, value $v_j$ is removed from domain set $D_j$ (or alternatively it is not added to domain set $D_j$ at the final iteration of step 352—i.e., step 352 is not performed when k=j) and the method then returns to step 310 with variable $X_j$ being the selected variable (i.e., variable $X_i$ on the flowchart) 360 such that the next value in its domain set will be assigned to that variable at step 316 (assuming it is not empty).

Example Implementation Details

For the conflict directed back-jumping method described above, as with MPS simulations generally, the neighbourhood set $N_i$ around a pixel $X_i$ can be defined (for example) in two ways: 1) predefined templates T around variable $X_i$ (e.g., SNESIM), and 2) the set of k-nearest simulated pixels to $X_i$ (e.g., direct sampling methods such as syn-processing). The shape of the template T and the number of simulated pixels k are user-defined variables. Note that methods which include forward checking (e.g., as described by FIGS. 2 and 3) require a predefined template and therefore the first of these options.

Availability of neighbourhood set $N_i$ around a variable (pixel) $X_i$ may be defined differently based on the neighbourhood set definition above. For the first definition of neighbourhood set, first a template library may be generated by scanning the training information (training image) with the templates and saving the patterns, $T_{TI}$, and their frequency. In an embodiment, in order to check the availability condition at a pixel $X_i$ and for a template T the following value may be computed:

$$d(T_i, T_{TI}) = \min_{T_{TI}} \left( \sum_{p \in T} \frac{I(T_i(p), T_{TI}(p))}{w(p)} \right) \quad (1)$$

Where p is a pixel of the template frame T, $T_i(p)$ and $T_{TI}(p)$ are the values of property at p in the simulation grid and training information, respectively, w(p) is a weight that is defined for each pixel in the template. It can be a constant value or a power of the Euclidean distance between p and central pixel of the template frame T. I is the difference between value of the simulated property at p in $T_i$ and $T_{TI}$, defined as:

$$I(T_i(p), T_{TI}(p)) = \begin{cases} 0 & p \text{ is not already simulated} \\ |T_i(p) - T_{TI}(p)| & p \text{ is already simulated} \end{cases} \quad (2)$$

If the simulated property is continuous $|T_i(p)-T_{TI}(p)|$ is the absolute value of difference and if the simulated property is discrete $|T_i(p)-T_{TI}(p)|$ is equal to 1 when $T_i(p) \neq T_{TI}(p)$ and 0 otherwise. The availability condition at pixel $X_i$ is satisfied if $d(T_i, T_{TI}) \leq \epsilon$, where $\epsilon$ is a user-defined variable.

For the second definition of the neighbourhood set, in order to check availability condition first, the k-nearest simulated pixels to $X_i$, i.e. $N_i$, may be selected—if the number of simulated pixels is less than k all of the simulated pixels are selected—and template N may be defined using the location of these pixels with reference to $X_i$, which is referred to as the central pixel of the template. Then the training image may be scanned with this template and the following value may be computed at each pixel q of the training image, where N is defined:

$$d(N_i, N_{TI}(q)) = \sum_{p \in N} \frac{I(N_i(p), N_{TI}(p, q))}{w(p)} \quad (3)$$

Where p is a pixel of the neighbourhood set frame N, $N_i(p)$ and $N_{TI}(p, q)$ are the values of property at p in the simulation grid and the training information, respectively. Other parameters in the above Equation (3) have the same definition as those in Equation (1). When $d(N_i, N_{TI}(q)) \leq \epsilon$, where $\epsilon$ is a user-defined variable, the search will stop and the availability condition is satisfied.

Figure 4:
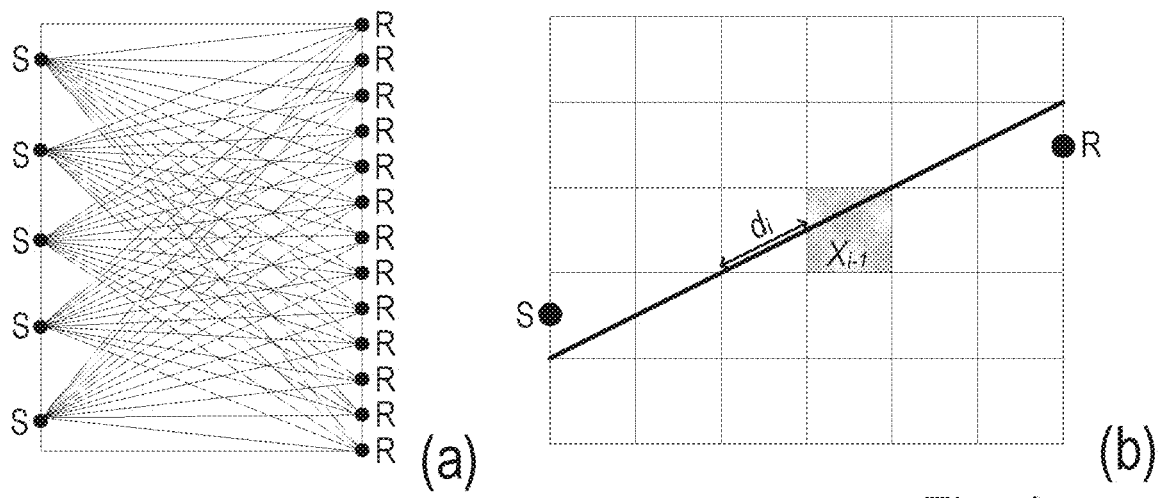
FIG. 4 illustrates (a) an example ray path geometry between source-receiver pairs, and (b) how travel time between a source receiver pair may be computed.

The availability constraint for a pixel in the MPS simulation can be extended to include other constraints, such as a measurement of an average of some properties in several pixels around that pixel. In this case, in addition to the availability constraint at each pixel, the average constraints for which the pixel is involved are checked and, if all the constraints are satisfied, the value is accepted. In one specific example, the MPS simulation may be constrained by cross-well tomography data, which is a collection of travel times between a set of source-receiver pairs sampling locations along two borehole trajectories. FIG. 4 helps illustrate this. FIG. 4(a) shows schematically, an example geometry of ray paths between sources S and receivers R. FIG. 4(b) illustrates how the travel time $t_{sr}$ between a source-receiver pair may be determined, using:

$$t_{sr} = \sum_{i=1}^{n} d_i \cdot x_i \quad (4)$$

Each measurement can be seen as a weighted sum of slowness values encountered along the ray path $x_i$; the weight of each pixel being equal to the length of ray path in that pixel $d_i$. Therefore, the generated MPS realizations in this example are constrained with both MPS properties and tomography data.

The measure applied to sort values in set V may be defined differently based on the neighbourhood set definition above. When a predefined template is used, the matched templates in the library may be used to compute the probability of each value in V; the matched templates are those for which $d \leq \epsilon$, where $\epsilon$ is a user-defined variable. The probability of value v in V may be computed by counting the number of matched templates that have the value v at their central pixel and dividing this number by total number of matches. A random draw based on these probabilities may then be used to sort values in V, or else they may be sorted in the order of their assigned probabilities (most probable first). The values may be sorted in an order based on a weighted random selection for each position in the order, the weighting determined by said probabilities.

When k-nearest neighbours are used to define the neighbourhood set, the search location in the training image may be used to sort values in V; after a matched neighbourhood set for which $d \leq E$ is found, its location is saved. If the algorithm needs to reassign the value at this location, the search for finding a matched neighbourhood set will continue from the saved location. Note that in this case the search path is predefined.

Another option for sorting values in V is an external measure such as probability of each value obtained from seismic data. A random draw based on these probabilities may be used to sort values in V, or else they may be sorted in the order of their assigned probabilities (most probable first). In another embodiment, the order may be random.

Figure 5:
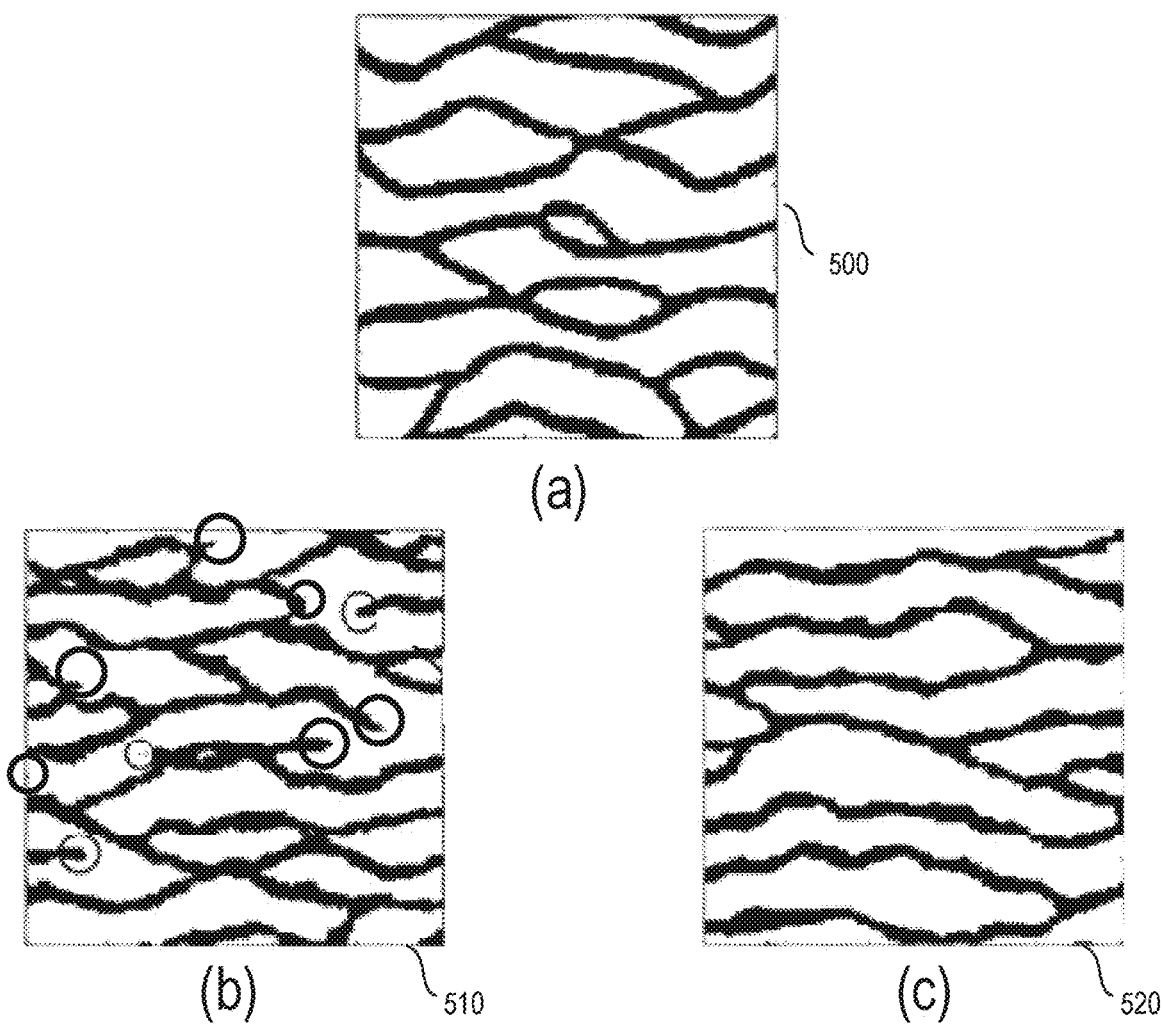
FIG. 5 illustrates the simulation results of a prior art method and a method as disclosed herein; showing (a) a training image, (b) a simulation result of a prior art method; and (c) a simulation result of a method as disclosed herein.

The main advantage of casting MPS simulation as a combinatorial optimization problem is that the generated model correctly preserves the MPS properties of the training information. FIG. 5 compares the result of applying this method with that of a conventional MPS simulation method (such as ignoring previously simulated pixels, as described above). FIG. 5(a) is a training image 500 (such as shown in U.S. Pat. No. 7,516,055), in which it can be seen that the black pixels define continuous bodies that extend from the left to the right boundary, such that none of these bodies terminate amongst white pixels. Therefore, it is expected that the MPS simulation result preserve this property. FIG. 5(b) shows that the results of a conventional MPS simulation 510 is not able to preserve this property, the circled areas of the simulation 510 showing examples where this property has not been preserved. In contrast, FIG. 5(c) shows the simulation result 520 of a method as disclosed herein, where it can be seen that the simulation result preserves this property.

Figure 6:
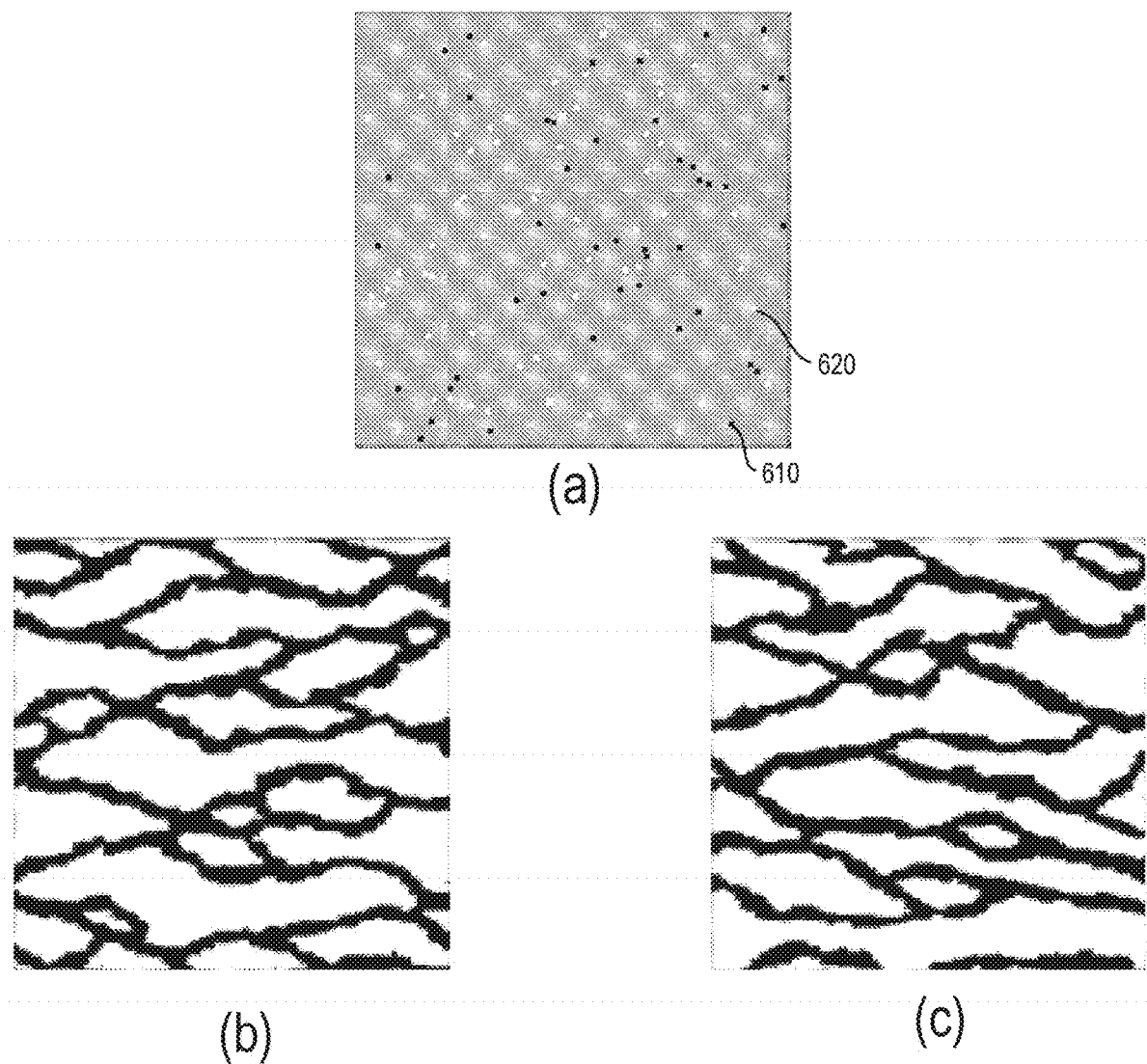
FIG. 6 illustrates (a) example locations of hard data and their values, and (b) and (c) the results of two exemplary MPS simulation realisations using the hard data of FIG. 6(a).

Due to proper preservation of the MPS properties, the methods proposed herein are able to generate a complete realization from a partially completed realization and also generate realizations that are conditioned by hard data, i.e., pixels for which the value of the property is known prior to simulation. FIG. 6 illustrates such an embodiment. FIG. 6(a) shows a representation of hard data, where the domain set comprises two values represented by black pixels 610 and white pixels 620. As the actual value of these pixels is known, all realisations of the MPS simulation, such as those shown in FIGS. 6(*b*) and 6(*c*), can be conditioned to the hard data such that these known pixels are fixed at the corresponding known values for that pixel. Consequently, methods disclosed herein may include using hard data, when available, to condition the simulation results.

The techniques described herein can improve production of geological models conditioned with different sources of information. This information can include hard data such as information from wells or soft data such as seismic measurements. This technique can be applied to perform geological modelling while inverting seismic data. The process may comprise a type of stochastic/geostatistical seismic inversion that applies more detailed prior geological information compared to current seismic inversion methods; current geostatistical inversions are limited to simple geostatistical models specified with variograms also known as two-point statistics. In addition, the methods described herein could be adapted to impose different constraints on the geological models such as continuity of channels which may be of importance for reservoir engineering applications.

One or more steps of the methods and concepts described herein may be embodied in the form of computer readable instructions for running on suitable computer apparatus, or in the form of a computer system comprising at least a storage means for storing program instructions embodying the concepts described herein and a processing unit for performing the instructions. As is conventional, the storage means may comprise a computer memory (of any sort), and/or disk drive, optical drive or similar. Such a computer system may also comprise a display unit and one or more input/output devices.

The concepts described herein find utility in all aspects of surveillance, monitoring, optimisation and prediction of hydrocarbon reservoir and well systems, and may aid in, and form part of, methods for extracting hydrocarbons from such hydrocarbon reservoir and well systems.

It should be appreciated that the above description is for illustration only and other embodiments and variations may be envisaged without departing from the spirit and scope of the invention.

The invention claimed is:

1. A computer-implemented method of detecting and extracting hydrocarbons from a hydrocarbon reservoir including a subsurface region by creating an image, the method comprising:
   defining a plurality of pixels of the image for describing the subsurface region, each pixel comprising a cell representing at least one of a subsurface area or a subsurface volume forming part of the subsurface region, at least one of the plurality of pixels being initially unassigned, each of the plurality of pixels of the image having corresponding thereto:
      a domain set, the domain set comprising possible values assignable to its corresponding pixel;
      a neighborhood set, each neighborhood set comprising a subset of the plurality of pixels of the image which neighbor its corresponding pixel; and
      a conflict set; and
   sequentially performing the following steps a) to g):
      (a) determining whether all pixels of said plurality of pixels have been assigned, and, if so, proceeding directly to step g);
      (b) if at step a) it is determined that not all of said plurality of pixels have been assigned, selecting an unassigned pixel from the plurality of pixels of the image as a selected pixel;
      (c) assigning a value to the selected pixel from the selected pixel's corresponding domain set, provided it is not empty;
      (d) assessing whether a constraint is satisfied with the selected pixel assigned the assigned value, wherein the constraint is based on a training image describing a conceptual geological model of a subsurface region;
      (e) if it is determined that the constraint being assessed is satisfied at step d), designating said selected pixel as an assigned pixel and returning to step a); and
      (f) if it is determined that the constraint being assessed is not satisfied at step d) with the selected pixel assigned the assigned value, updating the selected pixel's corresponding conflict set to include one or more conflict pixels, the conflict pixels being one or more previously assigned pixels comprised within the selected pixel's corresponding neighborhood set; and
      (g) outputting the image when all pixels of said plurality of pixels have been assigned;
   wherein, when it is determined during performance of any of steps d) through f) that the selected pixel's corresponding domain set comprises no values which satisfy the constraint, thereby indicating that the selected pixel is a dead-end pixel, the method further comprises:
      (1) determining a most recent conflict pixel from the selected pixel's corresponding conflict set, the most recent conflict pixel comprising the pixel in the selected pixel's corresponding conflict set which has been most recently assigned a value;
      (2) unassigning the values previously assigned to the selected pixel, the most recent conflict pixel, and all intervening pixels which were assigned values between the selected pixel being assigned a value and the most recent conflict pixel being assigned a value; and
      (3) returning to step a) with the selected pixel being the most recent conflict pixel; and
   wherein the constraint is satisfied for at least a first pixel of the plurality of pixels, and the constraint is not satisfied for at least a second pixel of the plurality of pixels.

2. The method as claimed in claim 1, further comprising, should the constraint be assessed not to be satisfied at step d):
   unassigning the assigned value from the selected pixel prior to performance of step f) and assigning, if available, a further value from the selected pixel's corresponding domain set.

3. The method as claimed in claim 1, further comprising updating the conflict set corresponding to the most recent conflict pixel with the conflict set corresponding to the selected pixel except for the most recent conflict pixel.

4. The method as claimed in claim 1, wherein the step of unassigning the values previously assigned to the selected pixel comprises returning the conflict set and domain set corresponding to each pixel being unassigned, to their state prior to the last performed iteration of steps (a) to (d).

5. The method as claimed in claim 1, wherein the constraint s additionally based on other data.

6. The method as claimed in claim 5, wherein the constraint is additionally based on an average of one or more properties of a plurality of pixels in the vicinity of the selected pixel.

7. The method as claimed in claim 1, wherein the plurality of pixels include one or more hard pixels for which a value is known, or for which a value is assigned by another means, the hard pixels never being selected at step b).

8. The method as claimed in claim 1, wherein values in a domain set are sorted according to a measure to determine the order that they are assigned at step c).

9. The method as claimed in claim 8, wherein the measure for sorting the values in a domain set comprises:
   determining a probability for each value in the domain set, the probability reflecting the likelihood that a value is an appropriate value for its corresponding pixel; and
   using the probabilities to sort the values.

10. The method as claimed in claim 9, wherein the values are sorted in the order of decreasing probability.

11. The method as claimed in claim 9, wherein the values are sorted in an order based on a weighted random selection for each position in the order, the weighting determined by the probabilities.

12. The method as claimed in claim 9, wherein the step of determining a probability uses a priori knowledge of the subsurface region.

13. A computer program product comprising a non-transitory, computer readable storage medium storing instructions which, when run on a suitable computer apparatus, cause the computer apparatus to perform operations for detecting and extracting hydrocarbons from a hydrocarbon reservoir including a subsurface region by creating an image, the operations comprising:
   defining a plurality of pixels of the image for describing the subsurface region, each pixel comprising a cell representing at least one of a subsurface area or a subsurface volume forming part of the subsurface region, at least one of the plurality of pixels being initially unassigned, each of the plurality of pixels of the image having corresponding thereto:
      a domain set, the domain set comprising possible values assignable to its corresponding pixel;
      a neighborhood set, each neighborhood set comprising a subset of the plurality of pixels of the image which neighbor its corresponding pixel; and
      a conflict set; and
   sequentially performing the following steps a) to g):
      (a) determining whether all pixels of said plurality of pixels have been assigned, and, if so, proceeding directly to step g);
      (b) if at step a) it is determined that not all of said plurality of pixels have been assigned, selecting an unassigned pixel from the plurality of pixels of the image as a selected pixel;
      (c) assigning a value to the selected pixel from the selected pixel's corresponding domain set, provided it is not empty;
      (d) assessing whether a constraint is satisfied with the selected pixel assigned the assigned value, wherein the constraint is based on a training image describing a conceptual geological model of a subsurface region;
      (e) if it is determined that the constraint being assessed is satisfied at step d), designating said selected pixel as an assigned pixel and returning to step a); and
      (f) if it is determined that the constraint being assessed is not satisfied at step d) with the selected pixel assigned the assigned value, updating the selected pixel's corresponding conflict set to include one or more conflict pixels, the conflict pixels being one or more previously assigned pixels comprised within the selected pixel's corresponding neighborhood set; and
      (g) outputting the image when all pixels of said plurality of pixels have been assigned;
   wherein, when it is determined during performance of any of steps d) through f) that the selected pixel's corresponding domain set comprises no values which satisfy the constraint, thereby indicating that the selected pixel is a dead-end pixel, the instructions, when run on the computer apparatus, further cause the computer apparatus to perform operations comprising:
      (1) determining a most recent conflict pixel from the selected pixel's corresponding conflict set, the most recent conflict pixel comprising the pixel in the selected pixel's corresponding conflict set which has been most recently assigned a value;
      (2) unassigning the values previously assigned to the selected pixel, the most recent conflict pixel, and all intervening pixels which were assigned values between the selected pixel being assigned a value and the most recent conflict pixel being assigned a value; and
      (3) returning to step a) with the selected pixel being the most recent conflict pixel; and
   wherein the constraint is satisfied for at least a first pixel of the plurality of pixels, and the constraint is not satisfied for at least a second pixel of the plurality of pixels.

* * * * *